US007140884B2

(12) United States Patent

Brodsky et al.

(10) Patent No.: US 7,140,884 B2
(45) Date of Patent: Nov. 28, 2006

(54) CONTACT ASSEMBLY AND METHOD OF MAKING THEREOF

(75) Inventors: William L. Brodsky, Binghamton, NY (US); Amanda E. Mikhail, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/043,573

(22) Filed: Jan. 26, 2005

(65) Prior Publication Data

US 2006/0166522 A1 Jul. 27, 2006

(51) Int. Cl.
*H05K 1/00* (2006.01)

(52) U.S. Cl. .......................... 439/66; 439/700; 439/824

(58) Field of Classification Search .................. 439/66, 439/591, 700, 824; 5/716

See application file for complete search history.

(56) References Cited

U.S. PATENT DOCUMENTS 4,029,375 A * 6/1977 Gabrielian .................. 439/66
4,176,905 A * 12/1979 Marechal .................. 439/824
5,167,512 A * 12/1992 Walkup .................. 439/66
5,232,372 A 8/1993 Bradley et al.
5,273,438 A 12/1993 Bradley et al.
5,456,621 A * 10/1995 Gan .................. 439/700
5,473,510 A 12/1995 Dozier, II
5,791,914 A 8/1998 Loranger et al.
6,191,480 B1 2/2001 Kastberg et al.
6,287,126 B1 * 9/2001 Berger et al. .................. 439/66
6,341,962 B1 * 1/2002 Sinclair .................. 439/66
6,439,894 B1 8/2002 Li
6,491,527 B1 * 12/2002 Smith .................. 439/66
6,494,748 B1 12/2002 Mori et al.
6,551,112 B1 * 4/2003 Li et al. .................. 439/66
6,624,645 B1 9/2003 Haseyama et al.
6,659,778 B1 12/2003 Li
6,669,489 B1 12/2003 Dozier, II et al.
6,672,881 B1 1/2004 Evans
6,722,893 B1 * 4/2004 Li et al. .................. 439/66
6,909,056 B1 * 6/2005 Vinther .................. 174/260
6,944,899 B1 * 9/2005 Gladney .................. 5/716
7,047,581 B1 * 5/2006 Gladney .................. 5/716
2002/0019153 A1 2/2002 Audet et al.
2002/0055282 A1 5/2002 Eldridge et al.
2002/0187663 A1 12/2002 Li

FOREIGN PATENT DOCUMENTS

JP 6052942 A 4/1994

* cited by examiner

*Primary Examiner*—Gary Paumen
(74) *Attorney, Agent, or Firm*—Cantor Colburn LLP

(57) ABSTRACT

A contact assembly including an insulative carrier having a plurality of passages formed therein. A spring contact is positioned in the plurality of passages. The spring contact includes a helical spring and a contact plate affixed to one end of the helical spring. The contact plate has a plurality of portions extending away from the contact plate and extending away from the helical spring.

5 Claims, 4 Drawing Sheets

CONTACT ASSEMBLY AND METHOD OF MAKING THEREOF

BACKGROUND

The invention relates generally to contact assemblies and in particular to a spring-biased, grid contact assembly and method of manufacturing thereof.

Integrated circuits are typically housed within a package that is designed to protect the integrated circuit from damage, provide adequate heat dissipation during operation, and provide electrical connection between the integrated circuit and the leads of a printed circuit board. Several conventional packages are in the prior art including land grid array (LGA), pin grid array (PGA), ball grid array (BGA), and column grid array (CGA).

In integrated circuit (IC) packages, terminal lands are arranged on one major face of the package in a pattern corresponding with mounting pads, or leads, on the surface of a circuit board or the like. The device package is mounted on the circuit board by soldering the terminal lands to the mounting pads. Packages having a pattern of lands distributed over a major portion of one face thereof are called land grid array (LGA) packages. Similarly, packages having small solder bumps arranged in a pattern on one face for forming interconnections with external circuitry are usually referred to as ball grid array (BGA) packages.

In many applications, the soldering of the leads of the IC package to the printed circuit board is undesirable. For example, it is impossible to visually locate a short or ground between the IC package and printed circuit board. Usually, an expensive X-ray technique is required to inspect the connections since the leads are hidden under the package. Further, the increasing number of leads being provided by IC packages makes the soldering of the packages to printed circuit boards more difficult.

Accordingly, in the prior art, an improved connector has been developed which is designed to eliminate the need for the soldering the leads of an IC package to a printed circuit board. One example of a device which satisfied this criteria is the wadded wire of "fuzz ball" socket. The "fuzz ball" socket comprises a non-conductive substrate formed with a plurality of through holes which each house a contact element. The contact elements are formed by forcing a predetermined length of gold plated wire into a through hole such that the wire will bend haphazardly into a jumbled contact that extends through the through hole and resembles a piece of steel wool. To mount an IC package to a printed circuit board, the "fuzz ball" socket is tightly sandwiched between the printed circuit board and the package to tightly secure to the "fuzz ball" socket. It can be appreciated, sufficient pressure must be applied to both the "fuzz ball" socket and the package, respectively, to maintain electrical connections between the lands of the package and the printed circuit board via the "fuzz ball" socket.

As the number of lands and corresponding "fuzz ball" contacts are increased, the pitch between contacts is maintained increasing the module size correspondingly with increased manufacturing problems due to the number of contacts. The placement of individual wires into evermore through holes requires tremendous logistics. Furthermore, "fuzz ball" sockets are relatively expensive due to costly manufacturing including the placement of individual wires into the through holes to form the various "fuzz ball" contacts. Additionally, the great force required to push the ball leads of a BGA package into contact with the "fuzz ball" socket creates wear on the BGA ball leads and increases the likelihood of distorting the ball leads.

Wadded wire contact performance is statistically based due to fabrication techniques. This means that the number of contact points and bulk resistance varies contact to contact which requires testing of every contact to verify performance and higher contact normal force. These contacts are also susceptible to physical handling damage. The spring rate of these contacts is relatively high with a low working range of compressions (i.e. about 3 mils).

Other contact assemblies use shear stamped LGA contacts. Such contacts typically have low compliance or high compression stiffness that requires a high nominal contact normal force to provide enough deflection to accommodate packaging tolerances. Stamped sheet contacts of a leaf spring design result in relatively long parallel contact structures with corresponding high electrical coupling which increases near and far end noise limiting signal integrity at high circuit (i.e. clock) speeds. Furthermore, it is desirable to achieve high contact stress and the connection interface, which results in a more reliable connection. Thus, there is a need in the art for a contact array that provides high contact interface stress with a low connection compression force, which in essence results in a low force.

SUMMARY OF THE INVENTION

One embodiment is a contact assembly including an insulative carrier having a plurality of passages formed therein. A spring contact is positioned in the plurality of passages. The spring contact includes a helical spring and a contact plate affixed to one end of the helical spring. The contact plate has a plurality of portions extending away from the contact plate and extending away from the helical spring.

Another embodiment is a contact assembly including an insulative carrier having a plurality of passages formed therein. A spring contact positioned in the plurality of passages. The spring contact includes a helical spring formed from a wire having a non-round cross-section and a wire longitudinal axis, the wire being twisted the wire longitudinal axis.

Another embodiment is a contact assembly including an insulative carrier having a plurality of passages formed therein. A spring contact positioned in the plurality of passages. The spring contact includes a helical spring formed from a plurality of wires, each wire having a longitudinal axis, the plurality of wires being twisted about their longitudinal axes.

Another embodiment is a contact assembly including an insulative carrier having a plurality of passages formed therein. A spring contact positioned in the plurality of passages. The spring contact includes a helical spring and a collar affixed to one end of the helical spring. The collar has a plurality of fingers extending away from the collar and extending away from the helical spring.

DETAILED DESCRIPTION

Figure 1:
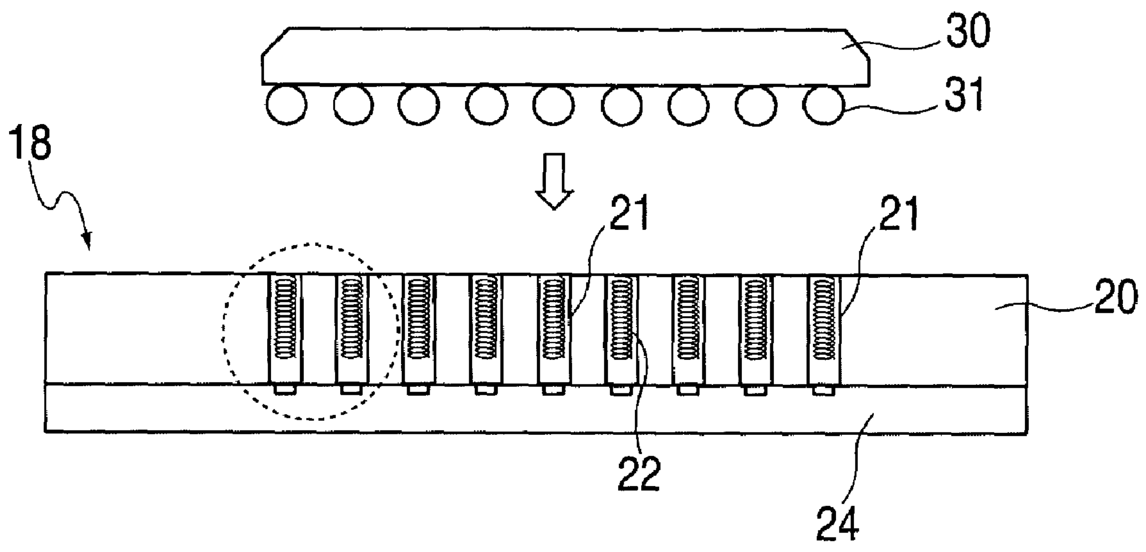
FIG. 1 depicts a contact assembly in an embodiment of the invention.

FIG. 1 depicts a contact assembly 18 in an embodiment of the invention. The contact assembly includes an insulative carrier 20 having a number of passages 21 formed therein in a grid pattern. A spring contact 22 is positioned in each passage 21 to establish electrical contact between a module 30 and a printed circuit board 24. The module 30 may be an integrated circuit device having a electrical interconnect 31 on a bottom surface, such as a land grid array, ball grid array, etc. The spring contacts 22 establish electrical connection between the module 30 and the printed circuit board 24. The spring contacts 22 are held in a compressed state by an external actuation mechanism (not shown). It is understood that the contact assembly 18 may be used to interconnect other components (e.g., module to test fixture) and is not limited to the embodiment shown in FIG. 1.

Figure 2:
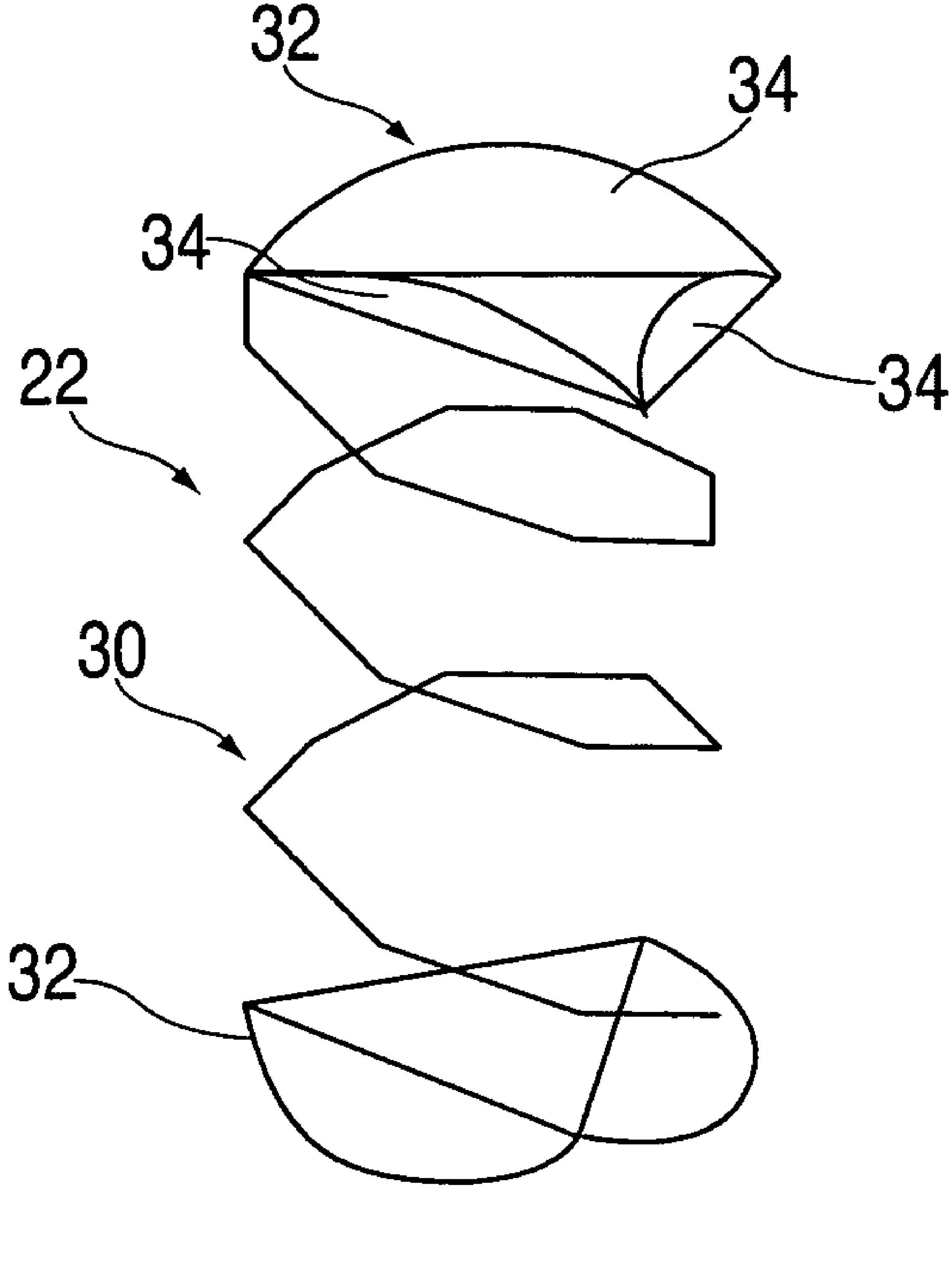
FIG. 2 depicts a spring contact in an embodiment of the invention.
Figure 3A:
FIGS. 3A–3E depict exemplary wire cross-sections.
Figure 3B:
Figure 3C:
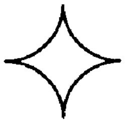
Figure 3D:
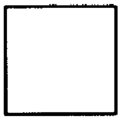
Figure 3E:
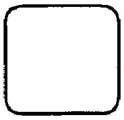

FIG. 2 depicts a spring contact 22 in an embodiment of the invention. Spring contact 22 includes a spring 30 (e.g., helically formed) and a contact plate 32 secured to one or both ends of the spring 30. In an embodiment of the invention, the contact plate 32 is a circular having three portions 34 bent away from the spring 30. It is understood that any number of bent portions may be used. The bent portions 34 provide redundant high stress contacts. Spring 30 and contact plate 32 can be soldered, welded, ultra-sonic bonded, adhesively bonded with conductive adhesive, or similar process.

The use of a circular contact plate 32 with three corners turned up provides three points of redundant contact that sit in a stable fashion when compressed. An estimate of a contacts intrinsic failure rate scaling (IFRS) factor is the number of contacts in series divided by number of contacts in parallel. For a three point contact plate 32 the IFRS would be 0.66. Existing designs known to be reliable have an IFRS factor of approximately 0.28 (2/7). For reference, an LGA contact with a single point of contact at each end would have an IFRS of 2, therefore this embodiment shows a significant improvement in contact reliability. In addition, the number of upturned corners can be increased and/or optimized to obtain the desired IFRS for the contact system. Because the spring 30 is helical, it can be modeled electrically as an extension of the printed wiring board 24 as a plated through hole so the discontinuity should be minimized based on the spring geometry used. Further, the spring 30 and contact plate 34 can be optimized separately.

The spring 30 may be made of conductive wire (Cu, Fe, Au, etc.) and have a round or non-round cross-section. The process involves forming the coil spring 30. The contact plates 32 are the secured to one or both ends of spring 30 through soldering, welding, etc. The spring 30 and contact plate 32 may then be plated with a high conductivity plating (e.g., copper) to lower the spring contact bulk resistance. The spring contacts 22 are then positioned in the passages 21 in the insulative carrier 20.

In a second embodiment of the invention, the spring contact 22 is formed from a wire of a non-round cross-section that is twisted in a spiral fashion along the longitudinal axis of the wire and is then formed into a helical coil spring. Such non-round cross sections include oval, triangular, square, pentangle, football, harlequin, etc. These shapes could be created by rolling, drawing, coining, or other process known in the industry.

FIGS. 3A–3E depict exemplary non-round cross-sections including football, oval, harlequin, square and pillow shapes, respectively. When compared to the oval cross-section, the football cross-section provides a point contact where the ridge of the spiral hits the contact area providing higher contact stresses. When compared to the square or pillow cross-sections, the harlequin cross-section gives sharper point contact where the ridge of the spiral hits the contact area.

In the second embodiment, the contact plates 32 are not used. The ends of the spring 30 may be formed in a planar loop substantially perpendicular to the longitudinal axis of the spring 30 and substantially parallel to mating pad of the PCB to mate with electrically conductive pad of mating electrical component. This planar loop provides multiple points of high stress contact if the twisting pitch is chosen accordingly (i.e., pitch substantially less then circumference of contact structure). Alternatively, the loop plane could be substantially parallel to the longitudinal axis of the spring and substantially perpendicular to the electrically conductive pad of mating electrical component allowing an additional contact interface stress riser by generating a 'Hertzian' contact geometry with the twisted contact wire.

Other variations include filling the helical coil spring 30 with a wadded wire structure (e.g., gold wire) to reduce bulk contact resistance through multiple conductive paths. The helical coil spring 30 may be overmolded with an elastomeric material (e.g., a soft rubber) to reduce handling damage. The bulk contact resistance of the helical spring 30 may be enhanced by forming the spring 30 of a non-prismatic wire or non-uniform length along wire length. For example, the cross-section of the wire may vary in dimension such that the central portion of the wire is wider than the end portions.

This embodiment provides a one-piece mechanical design for manufacturing simplicity. Assuming two points of contact per interface, the IFRS would be 1. If the wire twist pitch is reduced, the IFRS could be lowered to 0.66 which results in a better contact. The corners of the twisted wire present a relatively small area of influence in which particles (e.g., dust) could degrade contact performance. The edge contact regions would provide higher contact (i.e., Hertzian) stress that improves contact reliability. The spring contact may be fabricated from metallic spring with lower electrical conductivity and then be plated with a high conductivity plating to lower the contact bulk resistance. (e.g., stainless steel spring with copper overplate).

A first method of manufacturing the spring contact of the second embodiment includes obtaining a metal wire in an annealed state, twisting the wire about its longitudinal axis and forming the twisted wire into a helical spring. The spring may then be heat treated and bulk plated with a highly conductive plating. The spring contacts are then positioned in carrier 20.

Alternatively, the spring contact of the second embodiment may be made from a pre-plated metal wire in heat-treated state. The wire is then twisted along its longitudinal axis and formed into a helical spring. The spring may optionally be plated to cover the cut ends of the twisted wire. The spring contacts are then positioned in carrier 20.

In a third embodiment, multiple wires of a round or non-round cross-section are twisted in a spiral fashion along the longitudinal axis of the wires. The non-circular geometries could include oval, triangular, square, pentangle, football, harlequin, etc. These shapes could be created by rolling, drawing, coining, or other process known in the industry. The twisted wires are then formed into a helical coil spring. The ends of the spring 30 may be formed in a planar loop substantially perpendicular to the longitudinal axis of the spring 30 and substantially parallel to mating pad of the PCB to mate with electrically conductive pad of mating electrical component. This planar loop provides multiple points of high stress contact if the twisting pitch is chosen accordingly (i.e., pitch substantially less then circumference of the contact structure). Alternatively, the loop plane could be substantially parallel to the longitudinal axis of the spring and substantially perpendicular to the electrically conductive pad of the mating electrical component allowing an additional contact interface stress riser by generating a 'Hertzian' contact geometry with twisted contact wire.

Other variations include filling the helical coil spring 30 with a wadded wire structure (e.g., gold wire) to reduce bulk contact resistance through multiple conductive paths. The helical coil spring may be overmolded with an elastomeric material (e.g., a soft rubber) to reduce handling damage. The bulk contact resistance of the helical spring 30 may be enhanced by forming the spring 30 of a non-prismatic wire or non-uniform length along wire length. For example, the cross-section of the wire may vary in dimension such that the central portion of the wire is wider than the end portions.

Assuming two points of contact per interface, the IFRS for this embodiment would be 1. This design may provide a shorter wire twist pitch providing a lower IFRS. The twisted pairs of wire may have a lower moment of inertia for the same cross sectional area than a single wire form providing a lower resistance to force. The spring contact may be fabricated from metallic wire with lower electrical conductivity and then be plated with a high conductivity plating to lower contact bulk resistance. (e.g., stainless steel spring with copper over-plate).

A first method of manufacturing the spring contact of the third embodiment includes obtaining metal wires in an annealed state. The multiple strands of wire are twisted together into a bundle and then formed into the helical spring contact. The spring contact may then be heat treated and plated with a high conductivity plating. The spring contacts are then positioned in carrier 20.

Alternatively, the spring contact of the third embodiment may be made from a pre-plated metal wire in heat-treated state. In this process, multiple strands of wire are twisted together in a bundle and then formed into the helical spring contact. The spring may optionally be plated to cover cut ends of twisted wire. The spring contacts are then positioned in carrier 20.

Figure 4:
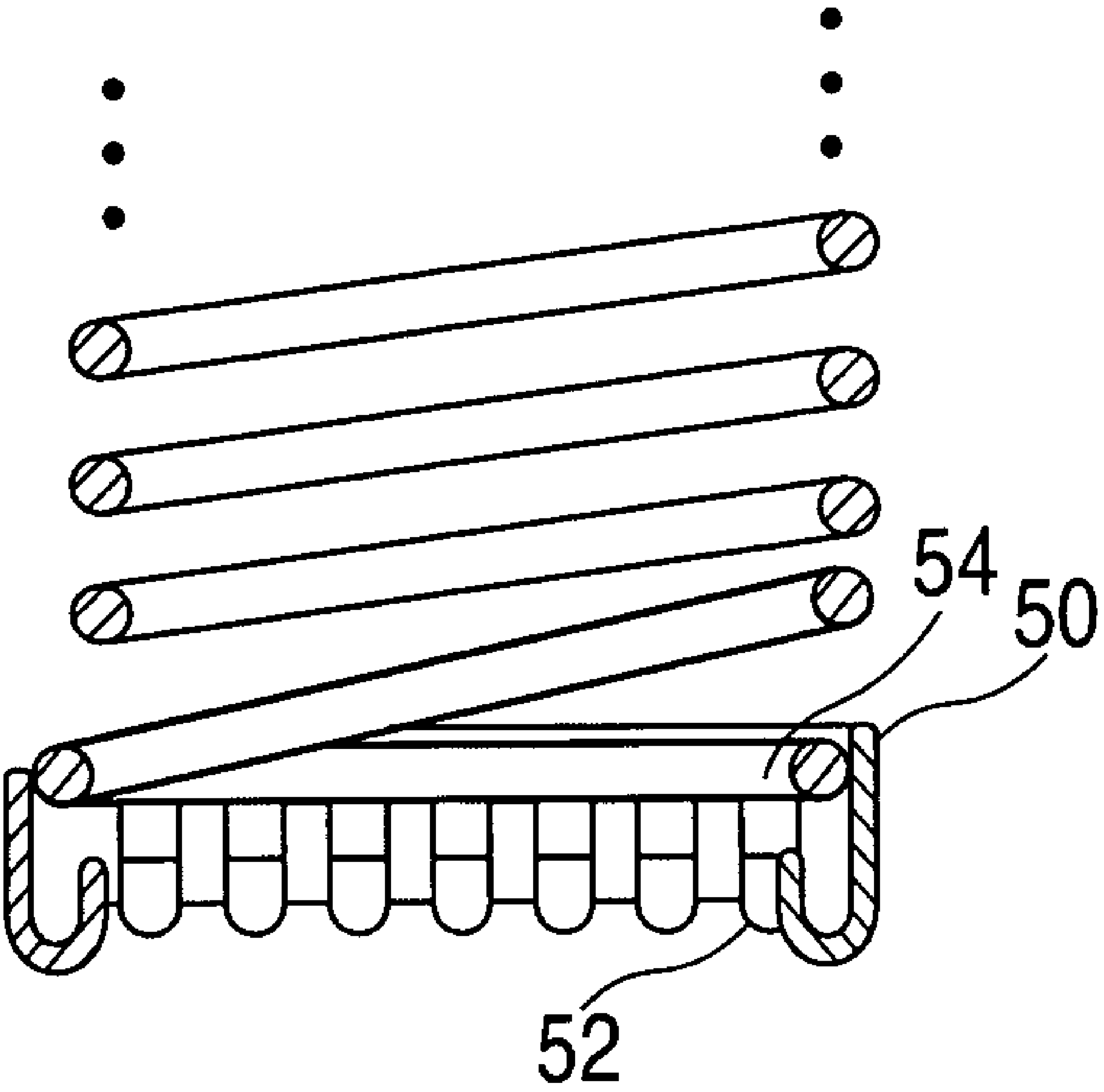
FIG. 4 depicts a spring contact in an alternate embodiment of the invention.

In a fourth embodiment, a fingered collar is placed around one or both of the planar ends of the helically-formed spring such that the fingers of the collar act as the multiple points of contact at the interface. FIG. 4 is a cross-sectional view of a portion of the spring contact in this embodiment. Collar 50 includes curled fingers 52. The collar may be attached by soldering, welding, ultra-sonic bonding, adhesive bonding with conductive adhesive, or similar process.

The fingered collar 50 may be formed by obtaining a rectangular piece of metal and forming vertical slits in the rectangle on one of the long sides. The fingers 52 created by the vertical slits are curled uniformly out of the plane of the rectangle to form redundant compliant contacts. The collar 50 is wrapped around and attached to the planar circle 54 formed by the helical spring end, such that the solid part of the collar is perpendicular to the plane of the loop of the spring, and the crown tabs curl towards the contact surface. If the collar 50 is wrapped such that the fingers curl inward to the center axis of the spring (as shown in FIG. 4), this increases the number of points of contact, as well as decreases the propensity of shorting to other contacts. If the fingers curl outward, shorting potential could increase. The curled fingers 52 form the compliant multiple-contact interface at the top and bottom of the spring. The greater number of fingers in the collar, the greater the number of multiple points of contact and the lower the intrinsic failure rate of the contact system. Due to the separate nature of the spring and the collar, each piece may be enhanced materially for the desired properties. The cross section of the wire in the fourth embodiment may be round or non-round as described above.

A method of manufacturing the spring contact of the fourth embodiment includes forming the collar as described above and forming the helical coil spring. The collar is then secured to the spring using known techniques. The spring contact, including the collar and the spring are then plated and lastly, positioned in the carrier 20.

Embodiments of the invention provide a spring contact assembly that establishes electrical contact between components and accommodates for manufacturing variability. Hardware manufacturing variability includes the following. Printed wiring board thickness variation is typically 2 to 5 mils depending on the number of power planes and plating process used. Variations significantly higher then this have been seen in unique situations. Ceramic module substrates can have a co-planarity or non-flatness tolerance in excess of 3 mils. Positive and negative substrate curvature is dependent on wiring design and process variable, i.e. not controllable. LGA contact height tolerances of 1 to 3 mils are not unusual.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed for carrying out this invention, but that the invention will include all embodiments falling within the scope of the claims.

What is claimed is:

1. A contact assembly comprising:
- an insulative carrier having a plurality of passages formed therein;
- a spring contact positioned in each of the plurality of passages, the spring contact including:
- a helical spring; and
- a contact plate affixed to one end of the helical spring, the contact plate having a plurality of bent portions formed from the contact plate and extending away from the helical spring.

2. The contact assembly of claim 1 wherein the number of portions is three.

3. The contact assembly of claim 1 wherein the contact plate is circular.

4. The contact assembly of claim 1 further comprising a second contact plate affixed to an other end of the helical spring, the second contact plate having a plurality of bent portions formed from the contact plate and extending away from the helical spring.

5. A contact assembly comprising:
- an insulative carrier having a plurality of passages formed therein;
- a spring contact positioned in each of the plurality of passages, the spring contact including:
- a helical spring; and
- a collar affixed to one end of the helical spring, the collar having a plurality of bent fingers formed from the collar and extending away from the helical spring, the bent fingers curling inwards towards a central axis of the helical spring.

* * * * *